US011812571B2

(12) United States Patent
Venkatesh et al.

(10) Patent No.: US 11,812,571 B2
(45) Date of Patent: *Nov. 7, 2023

(54) MAGNETIC ATTACHMENT MECHANISM WITH SAFETY LATCH FOR A DESKTOP DISPLAY

(71) Applicant: Apple Inc., Cupertino, CA (US)

(72) Inventors: Sunita Venkatesh, San Francisco, CA (US); David H. Narajowski, San Jose, CA (US); Lauren M. Farrell, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/650,218

(22) Filed: Feb. 7, 2022

(65) Prior Publication Data

US 2022/0240403 A1    Jul. 28, 2022

Related U.S. Application Data

(63) Continuation of application No. 16/557,486, filed on Aug. 30, 2019, now Pat. No. 11,246,233.

(Continued)

(51) Int. Cl.
*G06F 1/16*     (2006.01)
*H05K 5/02*     (2006.01)
*H01F 7/02*     (2006.01)

(52) U.S. Cl.
CPC ......... *H05K 5/0234* (2013.01); *G06F 1/1601* (2013.01); *H01F 7/02* (2013.01);
(Continued)

(58) Field of Classification Search
CPC .. H05K 5/0234; H05K 5/0217; H05K 5/0221; H05K 5/0247; G06F 1/1601; H01F 7/02
See application file for complete search history.

(56) References Cited

U.S. PATENT DOCUMENTS 7,274,556 B2 *   9/2007   Chung ................. F16M 11/041
                                                    248/917
7,549,552 B2 *   6/2009   Hasegawa ......... H01L 21/67373
                                                    220/323

(Continued)

FOREIGN PATENT DOCUMENTS

CN      203799589 U      8/2014
CN      105674013 A      6/2016
(Continued)

OTHER PUBLICATIONS

PCT International Search Report for PCT International Application No. PCT/US2019/049827, dated Dec. 17, 2019 (6 pp.).

*Primary Examiner* — Abhishek M Rathod
*Assistant Examiner* — Keith DePew
(74) *Attorney, Agent, or Firm* — DORSEY & WHITNEY LLP (57) ABSTRACT

This application relates to a magnetic attachment mechanism attached to a stand for a display unit. The display unit includes a housing enclosing a display panel. The housing has a recess formed on a rear surface of the housing to accept the magnetic attachment mechanism. The magnetic attachment mechanism includes a magnetic element that is magnetically coupled to a corresponding magnetic element in the housing of the desktop display device when the magnetic attachment mechanism is inserted into the recess. The magnetic attachment mechanism also includes a latch mechanism that locks the display unit to the stand when the latch mechanism is engaged with a surface feature of the recess. The latch mechanism can be disengaged to allow for mobility of the display unit as separated from the stand.

20 Claims, 7 Drawing Sheets

Related U.S. Application Data (60) Provisional application No. 62/728,592, filed on Sep. 7, 2018.

(52) U.S. Cl.
CPC ......... *H05K 5/0217* (2013.01); *H05K 5/0221* (2013.01); *H05K 5/0247* (2013.01)

(56) References Cited

U.S. PATENT DOCUMENTS

| | | | | |
|---|---|---|---|---|
| 8,336,838 B2* | 12/2012 | Tsai | ...................... | G11B 33/123 |
| | | | | 248/220.21 |
| 8,469,408 B2* | 6/2013 | Li | ........................ | E05C 19/001 |
| | | | | 292/37 |
| 9,010,597 B2* | 4/2015 | Prescott | ................. | B60R 7/088 |
| | | | | 224/547 |
| 9,146,582 B2 | 9/2015 | Liang et al. | | |
| 9,684,336 B2 | 6/2017 | Hsu et al. | | |
| 9,880,586 B2 | 1/2018 | Ent et al. | | |
| 10,176,651 B2* | 1/2019 | Grziwok | ................ | F16M 13/00 |
| 10,262,511 B2* | 4/2019 | Chiang | ............... | H04M 1/0297 |
| 10,969,825 B2* | 4/2021 | Lo | ........................ | G06F 1/1632 |
| 2012/0267491 A1* | 10/2012 | Chiu | ...................... | F16M 13/00 |
| | | | | 248/221.11 |
| 2013/0181492 A1* | 7/2013 | Prescott | ................. | B60R 7/088 |
| | | | | 297/217.1 |
| 2013/0303000 A1* | 11/2013 | Witter | ................... | F16B 5/0642 |
| | | | | 403/324 |
| 2014/0362517 A1* | 12/2014 | Moock | ................ | E05B 73/0082 |
| | | | | 248/553 |
| 2015/0201723 A1* | 7/2015 | Rayner | .................. | F16M 13/04 |
| | | | | 224/191 |
| 2016/0003270 A1* | 1/2016 | Franklin | ............... | H01F 7/0221 |
| | | | | 439/529 |
| 2016/0225204 A1* | 8/2016 | Grziwok | .............. | F16M 11/041 |
| 2017/0343028 A1 | 11/2017 | Chen et al. | | |
| 2018/0032104 A1* | 2/2018 | Schatz | ................. | G06F 1/1683 |
| 2018/0122201 A1* | 5/2018 | Chiang | .................. | H04M 1/02 |
| 2020/0081483 A1* | 3/2020 | Laurent | ................. | F16M 11/10 |
| 2020/0084902 A1* | 3/2020 | Venkatesh | ................ | H01F 7/02 |

FOREIGN PATENT DOCUMENTS

| | | |
|---|---|---|
| CN | 107453119 A | 12/2017 |
| EP | 3315816 A1 | 5/2018 |
| KR | 100664323 B1 | 1/2007 |
| KR | 20110002867 U | 3/2011 |

* cited by examiner

MAGNETIC ATTACHMENT MECHANISM WITH SAFETY LATCH FOR A DESKTOP DISPLAY

CROSS-REFERENCE TO RELATED APPLICATION(S)

This is a continuation of U.S. patent application Ser. No. 16/557,486, filed 30 Aug. 2019, and entitled "MAGNETIC ATTACHMENT MECHANISM WITH SAFETY LATCH FOR A DESKTOP DISPLAY," which claims priority to U.S. Provisional Patent Application No. 62/728,592, filed 7 Sep. 2018, and entitled "MAGNETIC ATTACHMENT MECHANISM WITH SAFETY LATCH FOR A DESKTOP DISPLAY," the entire disclosures of which are hereby incorporated by reference.

FIELD

The described embodiments relate generally to attachment mechanisms. More particularly, the present embodiments relate to a magnetic attachment mechanism with a safety latch for attaching a desktop display to a stand.

BACKGROUND

Desktop display devices may have display areas measuring 20 or more inches along a diagonal. For example, many desktop monitors include a display area measuring 27 inches along a diagonal, but these monitors are conventionally designed to be left on a desktop and physically connected to a power outlet and/or desktop computer or docking station. Optionally, the desktop monitor can be connected to a video source such as a set top box or a laptop computer with an HDMI (High-Definition Multimedia Interface) output.

However, in some instances, it is preferable that these monitors to be more mobile such that the monitor can be detached from the stand and taken on the go. For example, those in industries including in film, advertising, or fashion may prefer to take a large format display to locations to provide enriched presentations that can be viewed by a large number of people. Conventionally, however, these people have relied on small format devices such as a tablet computer.

SUMMARY

This paper describes various embodiments that relate to a magnetic attachment mechanism attached to a stand for a display unit. The display unit includes a housing enclosing a display panel. The housing has a recess formed on a rear surface of the housing to accept the magnetic attachment mechanism. The magnetic attachment mechanism includes a magnetic element that is magnetically coupled to a corresponding magnetic element in the housing of the desktop display device when the magnetic attachment mechanism is inserted into the recess. The magnetic attachment mechanism also includes a latch mechanism that locks the display unit to the stand when the latch mechanism is engaged with a surface feature of the recess. The latch mechanism can be disengaged to allow for mobility of the display unit as separated from the stand.

In some embodiments, a magnetic attachment mechanism is described that secures a display unit to a stand. The magnetic attachment mechanism includes a housing having a size and a shape corresponding to a recess formed in the display unit. A magnetic element is attached to the housing. When the magnetic attachment mechanism is inserted in the recess, the magnetic element is magnetically coupled with, via an attractive force, a corresponding magnetic element in the display unit positioned proximate the recess. A latch mechanism is included in the magnetic attachment mechanism and configured to automatically engage with a surface feature formed in the recess when the magnetic attachment mechanism is inserted into the recess. An actuating mechanism is included in the magnetic attachment mechanism and configured to lock the latch mechanism in an extended state that prevents the magnetic attachment mechanism from being extracted from the recess.

In some embodiments, the magnetic element and the corresponding magnetic element are permanent magnets. The permanent magnets may include a neodymium alloy.

In some embodiments, a shape of the housing is substantially cylindrical. In other embodiments, the shape of the housing can be rectangular, triangular, or any other regular or irregular shape that conforms with the shape of the recess.

In some embodiments, the latch mechanism includes a movable component that can be positioned between a first position in the extended state and a second position in a retracted state. The movable component can be biased towards the first position in the extended state by a biasing mechanism. The biasing mechanism can include a spring compressed between a surface of the movable component and a protrusion of a component of the housing. The surface feature can include a protrusion at an entrance of the recess that forms a slot in a radial surface of the recess. The movable component, when in the first position while the magnetic attachment mechanism is inserted in the recess, extends into the slot.

In some embodiments, the actuating mechanism is manually operated. In other embodiments, the actuating mechanism is operated via an electrical actuator such as a motor. The actuating mechanism can be coupled to a motor configured to rotate the actuating mechanism between the first position and the second position. The actuating mechanism can include slots for accepting a protrusion of movable components of the latch mechanism. The protrusion assist in moving the movable components between the extended state and the retracted state.

In some embodiments, a stand is described for a display unit that includes a housing with a recess formed therein. The stand includes a frame configured to be supported by a surface and a magnetic attachment mechanism coupled to the frame and configured to be inserted into the recess formed in the housing of the display unit. The magnetic attachment mechanism may include a first structural component that is secured to a structural member of the frame. The magnetic attachment mechanism may also a second structural component secured to the first structural component. The magnetic attachment mechanism may also include a permanent magnet disposed between the first structural component and the second structural component. The magnetic attachment mechanism may also include a latch mechanism disposed between the first structural component and the second structural component. The magnetic attachment mechanism may also include a cam mechanism movable between the first position and the second position. The latch mechanism may include a movable component biased by a spring to extend the movable component beyond an edge of the first structural component.

In some embodiments, the movable component of the latch mechanism is locked in an extended position when the cam mechanism is in the first position. The movable component of the latch mechanism is free to move between the extended position (or extended state) and the retracted position (or retracted state) when the cam mechanism is in the second position.

In some embodiments, the display unit includes a display area measuring at least twenty inches along a diagonal. The display unit can be designed to sit on a flat surface of a desktop when coupled to the frame of the stand. In some embodiments, the magnetic attachment mechanism further includes a set of contacts that electrically couple a signal or a power supply from the stand to the display unit.

In some embodiments, a modular display system is described to enable mobility of large format display devices. The modular display system includes a display unit having a housing and a panel disposed in the housing. The housing includes a recess configured to mate with a stand for the display unit. The modular display system includes a magnetic attachment mechanism associated with the recess and attached to the stand. The magnetic attachment mechanism includes a magnet and a latch mechanism that engages with a surface feature in the recess when the magnetic attachment mechanism is inserted into the recess.

In some embodiments, the magnet is a neodymium magnet. In some embodiments, the display unit includes a second magnet disposed in the housing proximate the recess. The second magnet can be characterized by a magnetic dipole oriented relative a magnetic dipole of the magnet. When the magnetic attachment mechanism is inserted in the recess, an attractive force is generated between the second magnet and the magnet.

In some embodiments, the latch mechanism includes a movable component having a protrusion. The protrusion is configured to fit in a slot of an actuating mechanism movable between a first position and a second position. The actuating mechanism, when in the first position, operates to lock the movable component in an extended position.

In some embodiments, the magnetic attachment mechanism is cylindrical and the latch mechanism includes at least two movable components spaced around a perimeter of the magnetic attachment mechanism.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

A modular desktop display is disclosed herein that enables a display unit of the desktop display to be easily detached from a stand, thereby allowing the display unit more mobility than conventional display units that are securely (and in some cases, permanently) fastened to the stand via mechanical fasteners such as screws. The display unit may include a housing and a recess formed in the housing. The shape of the recess enables a magnetic attachment mechanism, secured to a stand, to be inserted into the recess. The magnetic attachment mechanism can include a magnetic element that interacts with a corresponding magnetic element included in the display unit. The corresponding magnetic element may be positioned along a surface defined by the recess and/or in close proximity to the recess. An attractive force between the magnetic elements can hold the display unit to the magnetic attachment mechanism as well as aid a person in locating the display unit relative to the stand when attaching the display unit to the magnetic attachment mechanism.

In some embodiments, the magnetic attachment mechanism includes a latch mechanism that locks the magnetic attachment mechanism in the recess when the magnetic attachment mechanism is inserted into the recess. The latch mechanism engages with a surface feature of the recess. The latch mechanism can be disengaged via operation of an actuating mechanism, such as a component with slots formed therein that force movable components of the latch mechanism to retract into a housing of the magnetic attachment mechanism.

These and other embodiments are discussed below with reference to FIGS. 1-7; however, those skilled in the art will readily appreciate that the detailed description given herein with respect to these figures is for explanatory purposes only and should not be construed as limiting.

Figure 1:
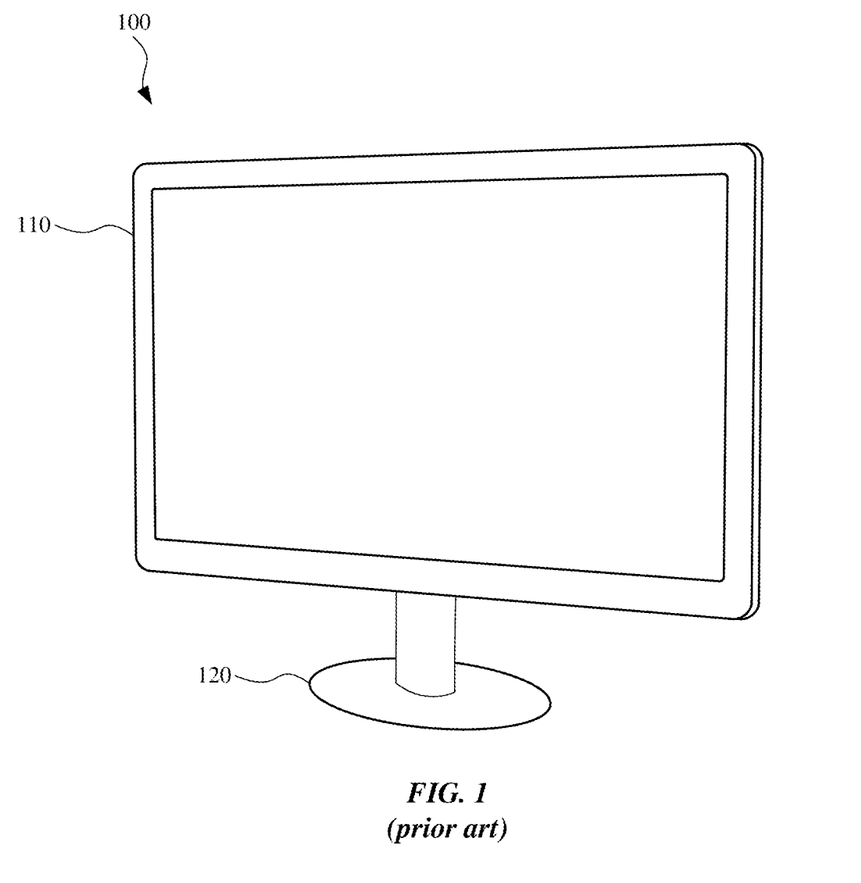
FIG. 1 illustrates a desktop display device, in accordance with the prior art.

FIG. 1 illustrates a desktop display device 100, in accordance with the prior art. As depicted in FIG. 1, the desktop display device 100 includes a display unit 110 attached to a stand 120. The stand 120 is designed to support the weight of the display unit 110 on a flat surface such as a desktop.

The display unit 110 can include a liquid crystal display (LCD) panel disposed in a frame. The display unit 110 can be placed over a backlight and can display text and images on a front surface (of the display unit 110). In some embodiments, the display unit 110 is overlaid by a glass substrate that can include a mask surrounding the visible area of the display unit 110. In other embodiments, the display unit 110 can be an organic light emitting diode (OLED) panel or the like instead of the LCD panel and backlight.

The desktop display device 100 also includes components for receiving video signals from a computing device (e.g., desktop computer, laptop computer, etc.) attached thereto. The video signals are processed by the components in order to control the display unit 110 to present video on the surface of the desktop display device 100. The video signals can be received from the computing device via a wired (e.g., High Definition Multimedia Interface—HDMI; DisplayPort—DP; etc.) or wireless communication channel. The desktop display device 100 can also include a power cable to connect the electronic components in the desktop display device 100 with an external power supply.

The desktop display device 100 is typically designed to be stationary and immobile. In other words, the desktop display device 100 remains on a desktop, typically plugged into a wall outlet that provides 120 VAC power (or equivalent), and includes a cable to attach to a port of a connected computing device. The desktop display device 100 is typically large and relatively heavy. For example, a diagonal measurement of a display area of the desktop display device 100 typically measures between 20 and 27 inches. In some cases, the display area can measure up to 40 inches or greater, typically when the desktop display device 100 is also utilized as a television display. Consequently, the display unit 110 is typically securely attached to the stand 120 with screws or other mechanical fasteners, which makes it difficult to detach the display unit 110 from the stand 120.

Figure 2:
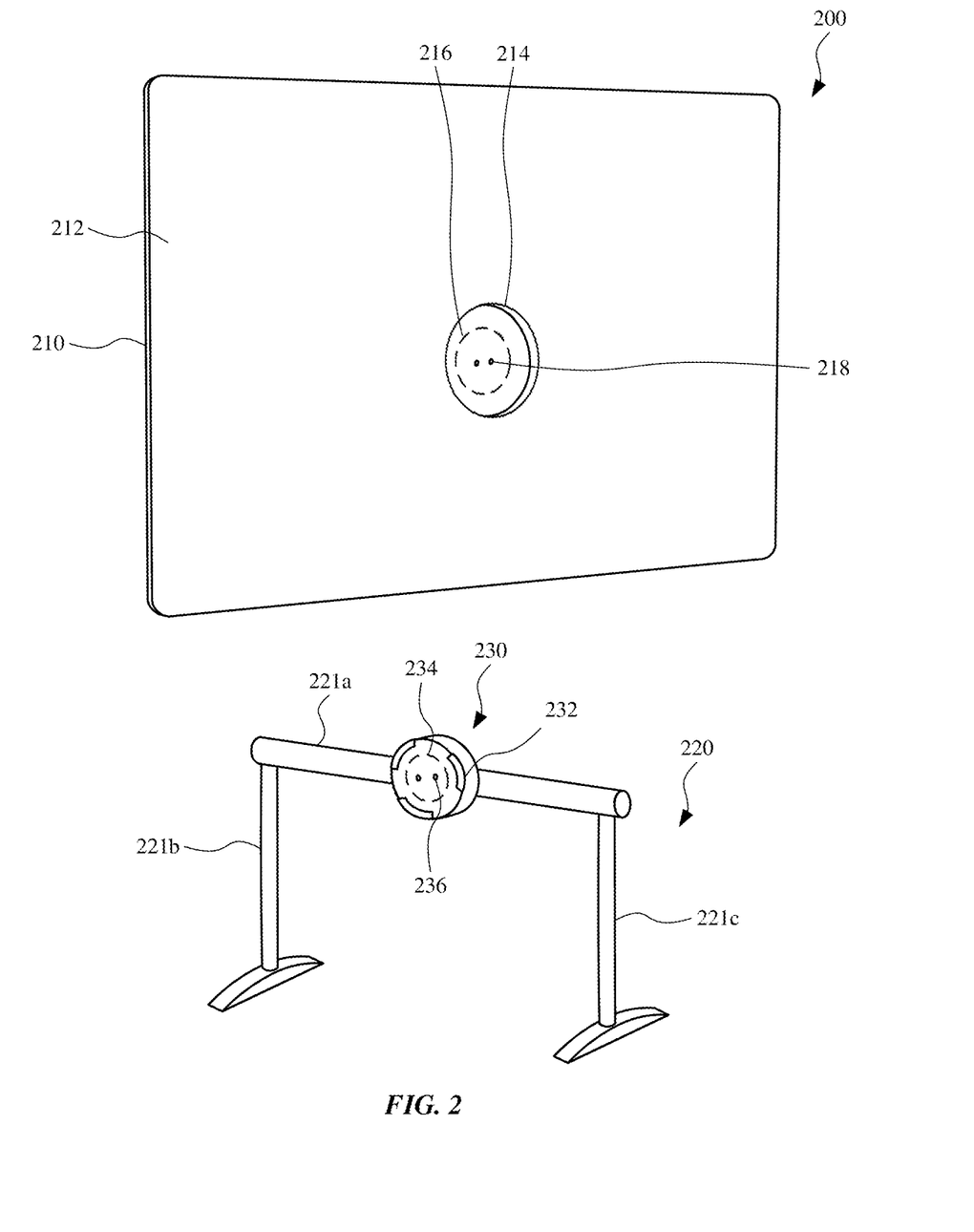
FIG. 2 illustrates a modular display system that enables the display unit to be detached from a stand, in accordance with some embodiments.

FIG. 2 illustrates a modular display system 200 that enables a display unit 210 to be detached from a stand 220, in accordance with some embodiments. A rear surface of a housing 212 of the display unit 210 is shown in FIG. 2. A recess 214 is formed in the rear surface of the housing 212. The recess 214 has a size and shape that conforms to a magnetic attachment mechanism 230 coupled to the stand 220. In some embodiments, the shape of the recess 214 is circular to conform to a cylindrical shape of the magnetic attachment mechanism 230. In other embodiments, the shape of the recess 214 is rectangular, triangular, an irregular closed curve, or any other shape to conform to a cross-sectional shape of the magnetic attachment mechanism 230.

A magnetic element 216 is disposed within an internal volume defined by the housing 212 of the display unit 210, and a magnetic element 234 is included in the magnetic attachment mechanism 230. The magnetic element 234 may be referred to as a corresponding magnetic element that is designed to magnetically couple with the magnetic element 216. In some embodiments, the magnetic element 216 and the magnetic element 234 are permanent magnets formed of a neodymium alloy (e.g., NdFeB), sometimes referred to as neodymium magnets. When the display unit 210 is brought in proximity of the magnetic attachment mechanism 230, an attractive force between the magnetic element 216 and the magnetic element 234 can be felt by a person holding the display unit 210 such that the magnetic fields generated by the magnetic elements provide a "homing function" that aids a person in aligning the magnetic attachment mechanism 230 with the recess 214.

The magnetic attachment mechanism 230 is inserted into the recess 214 as the attractive force aids in guiding the magnetic attachment mechanism 230 towards the offset surface of the recess 214. The attractive force can be sufficient to hold the display unit 210 against the magnetic attachment mechanism 230. In other words, a strength of the magnetic fields generated by the magnetic elements can be sufficient to provide an attractive force that holds the display unit 210 against the magnetic attachment mechanism 230.

In some embodiments, the magnetic attachment mechanism 230 includes a latch mechanism 232 that automatically locks the display unit 210 to the magnetic attachment mechanism 230 when the magnetic attachment mechanism 230 is fully inserted into the recess 214. The latch mechanism 232, which can also be referred to as a safety latching mechanism, prevents accidental disengagement of the magnetic attachment mechanism 230 with the display unit 210. The latch mechanism 232 can include movable components that interface with a surface feature of the recess 214 to lock the magnetic attachment mechanism 230 in the recess 214, thereby preventing the magnetic attachment mechanism 230 from being extracted from the recess 214 without disengaging the latch mechanism 232. The latch mechanism 232 can be manually operated by a person intending to disengage the magnetic attachment mechanism 230.

Alternatively, the magnetic attachment mechanism 230 can include an actuator configured to operate the latch mechanism 232. The actuator can be controlled by a user interface element (e.g., a button or switch) on the stand 220 or controlled via a signal from the display unit 210. The signal can be transmitted via a wireless or wired communication channel established with the display unit 210. In some embodiments, the display unit 210 communicates with the magnetic attachment mechanism 230 via a wireless communication channel, such as a communication channel established according to a Bluetooth® protocol or other Near Field Communication (NFC) protocol, as non-limiting examples. In other embodiments, a wired communication channel can be established via one or more contacts 218 disposed on a surface of the recess 214. The one or more contacts 218 can interface with corresponding contacts 236 disposed on a surface of the magnetic attachment mechanism 230. In some embodiments, the corresponding contacts 236 disposed on the surface of the magnetic attachment mechanism 230 corresponding couple a signal or a power supply from the stand 220 to the display unit 210. For example, the corresponding contacts 236 can provide a power supply, connected from the stand 220 to a wall outlet, to the display unit 210 to avoid the need to run a separate cable from the display unit 210 to the wall outlet.

The stand 220 can include a number of structural components that provide a base for supporting the display unit 210. For example, the stand 220 may include a structural component 221*a* that is carried by a structural component 221*b* and a structural component 221*c*. The structural components can be fixed, as shown in FIG. 2, or adjustable to change a position of the display unit 210 relative a desktop surface. It will be appreciated that the stand 220 could also be designed to be mounted to a wall instead of being configured to be supported on a desktop surface. In some embodiments, the structural components of the stand 220 can be omitted entirely where the magnetic attachment mechanism 230 includes features for mounting the magnetic attachment mechanism 230 directly to a corresponding surface, such as a wall.

The magnetic attachment mechanism 230 enables the display unit 210 to be easily detached from the stand 220 so that a person can transport the display unit 210 to various locations. In other words, the magnetic attachment mechanism 230 changes a traditionally immobile desktop display device into a mobile display unit that can be taken with a person wherever they would like to use the display unit 210.

It will be appreciated that, in some embodiments, the magnetic attachment mechanism 230 can be attached directly to a rear surface of the housing 212 of the display unit 210 and the stand 220 can be designed to include a recess that corresponds to the recess 214. However, the configuration shown in FIG. 2 may be advantageous in situations in which a rear surface of the housing 212 of the display unit 210 is likely to be set on a flat surface to avoid anything protruding from the rear surface of the housing 212.

Figure 3:
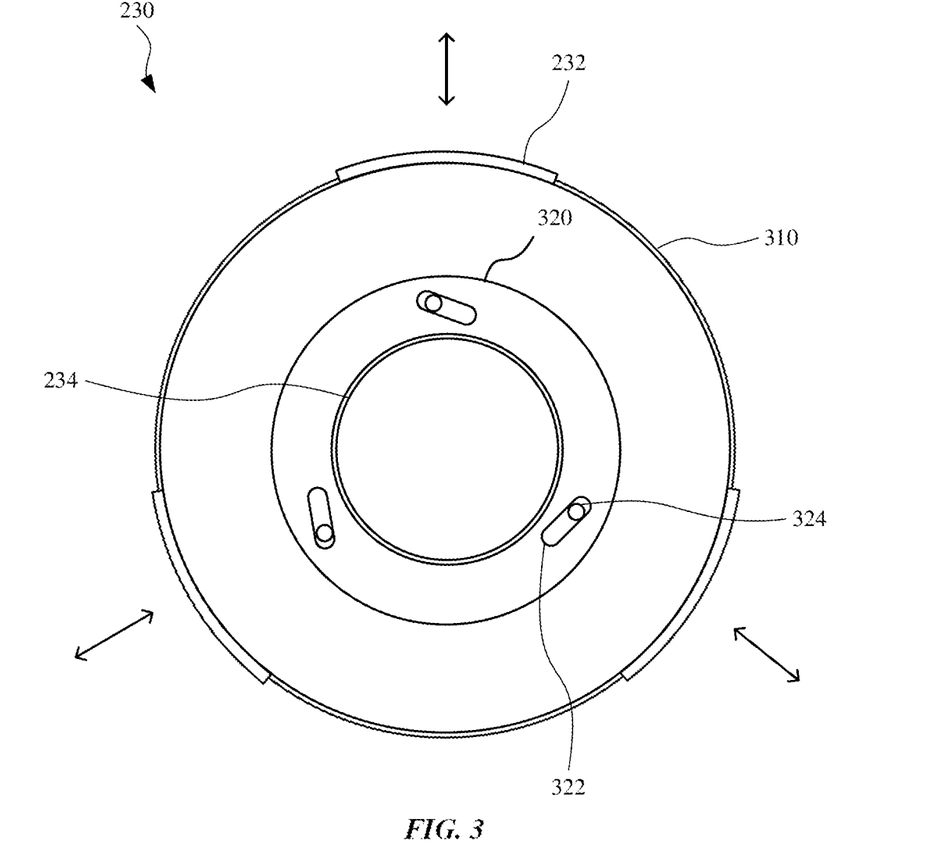
FIG. 3 illustrates a front view of the magnetic attachment mechanism, in accordance with some embodiments.

FIG. 3 is a front view of the magnetic attachment mechanism 230, in accordance with some embodiments. As depicted in FIG. 3, the magnetic attachment mechanism 230 includes a housing 310, or attachment mechanism housing, that is generally cylindrical. Also, the magnetic attachment mechanism 230 includes a central axis that is normal to the sheet. The magnetic element 234 is attached to the housing 310. In some embodiments, the magnetic element 234 is a cylindrical permanent magnet having a magnetic dipole oriented substantially parallel to or collinear with the central axis of the housing 310.

The latch mechanism 232 can include multiple components movable relative to the housing 310. The components can extend from or retract into the housing 310 in a radial direction normal to the central axis of the housing 310. As shown, the latch mechanism 232 includes three movable components. In other embodiments, the latch mechanism 232 can include any number of movable components, including as few as one movable component.

In some embodiments, the latch mechanism 232 is biased in the extended or the retracted position. For example, the movable components can be retained within a slot in the housing 310 and biased in one direction by one or more springs. For example, the movable components can be biased in the extended position (as shown) such that the movable components automatically engage a surface feature in the recess 214.

In some embodiments, the latch mechanism 232 is operable via an actuating mechanism 320. As depicted in FIG. 3, the actuating mechanism 320 includes slots that engage with a respective protrusion attached to each of the movable components. The actuating mechanism 320 rotates, thereby forcing the protrusions to move in the slots. For example, a slot 322 is engaged with a protrusion 324. The remaining slots and protrusion may include a similar relationship as shown with the slot and the protrusion 324. The slots are angled or otherwise configured to force the protrusions to move in a radial direction relative to the housing 310, which forces the movable components to retract into or extend from the housing 310. The actuating mechanism 320 can be manually operated such as via a piece of the actuating mechanism 320 that extends through a slot on an exterior of the housing 310 or can be electrically operated via an actuator, such as a DC motor and worm gear.

Figure 4:
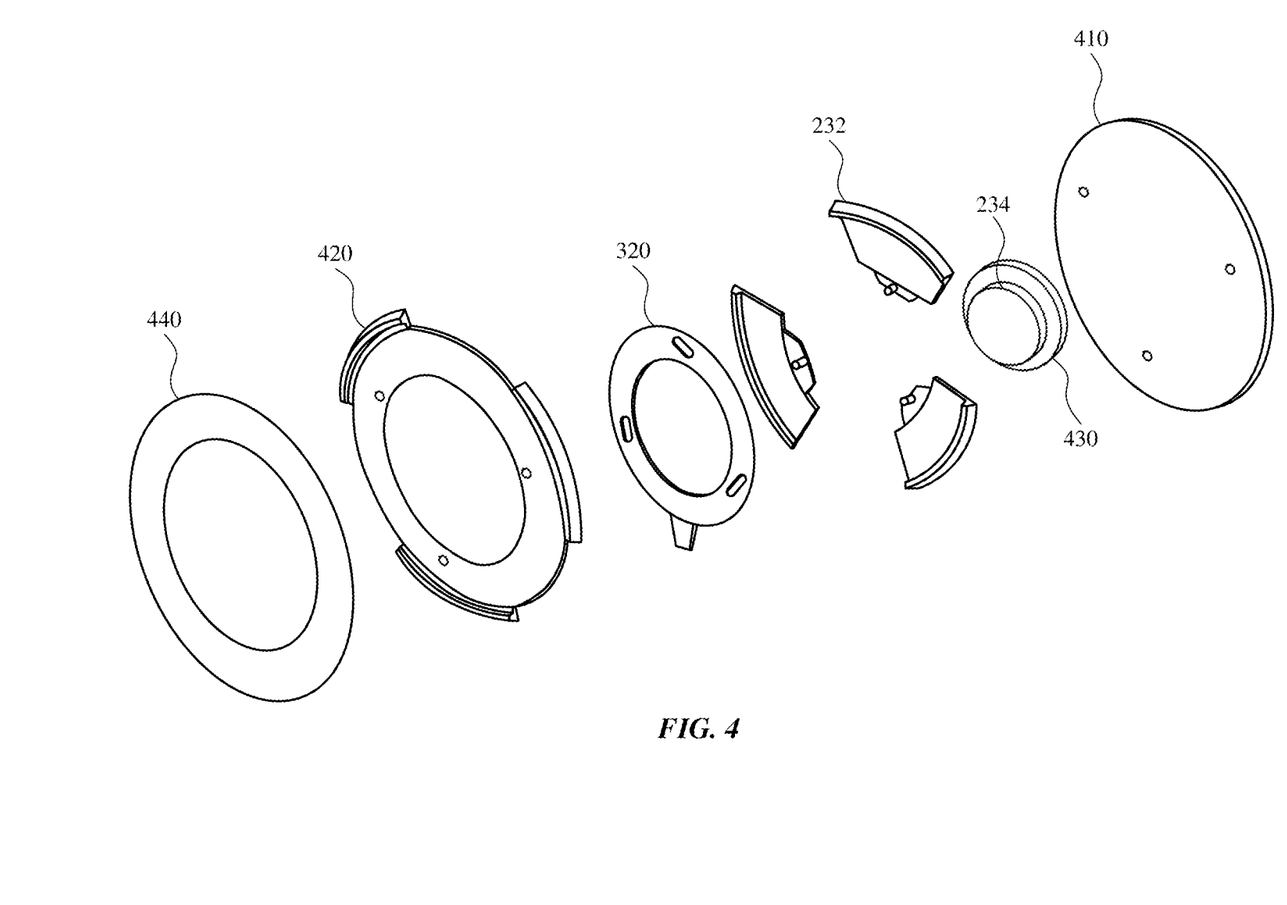
FIG. 4 illustrates an exploded view of the magnetic attachment mechanism, in accordance with some embodiments.

FIG. 4 is an exploded view of the magnetic attachment mechanism 230, in accordance with some embodiments. The housing 310 (shown in FIG. 3) of the magnetic attachment mechanism 230 can include a rear housing component 410 attached to a front housing component 420. In some embodiments, the front housing component 420 is attached to the rear housing component 410 via mechanical fasteners, such as screws. The latch mechanism 232, the actuating mechanism 320, and the magnetic element 234 are disposed between the front housing component 420 and the rear housing component 410. It will be appreciated that the actuating mechanism 320 in FIG. 4 is shown with a piece that extends through a slot between the rear housing component 410 and the front housing component 420 to allow for manual operation.

In some embodiments, the magnetic attachment mechanism 230 can include a magnetic shunt 430 disposed between the magnetic element 234 and the rear housing component 410. The magnetic shunt 430 is formed from a ferromagnetic material that helps shield a magnetic field generated by the magnetic element 234 from external components proximate the opposite side (not shown in FIG. 4) of the rear housing component 410.

In some embodiments, the magnetic attachment mechanism 230 also includes a pad 440 that helps to cushion contact between the magnetic attachment mechanism 230 and the inner surface of the recess 214 of the housing 212 (shown in FIG. 2). The pad 440 can be made of a material such as Delrin® or some other polymer material that has a low coefficient of friction to reduce wear between the magnetic attachment mechanism 230 and the rear surface of the recess 214.

Figure 5A:
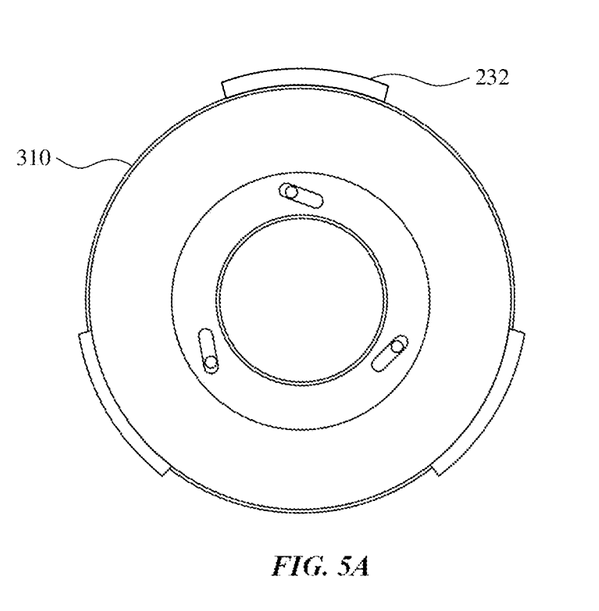
FIG. 5A illustrates an extended state of the latch mechanism, in accordance with some embodiments.

FIG. 5A illustrates an extended state of the latch mechanism 232, in accordance with some embodiments. The movable components of the latch mechanism 232 are shown extended and protruding beyond an external surface of the housing 310 of the magnetic attachment mechanism 230. In the extended state, at least a portion of the movable components extends past an external surface of the housing 310 of the magnetic attachment mechanism 230 such that the movable components interface with a surface feature in the recess 214 of the housing 212 (shown in FIG. 2).

Figure 5B:
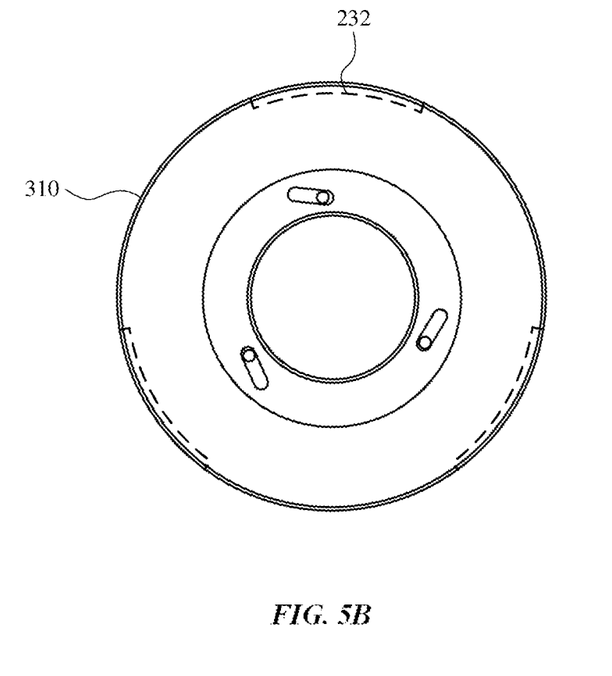
FIG. 5B illustrates a retracted state of the latch mechanism, in accordance with some embodiments.

FIG. 5B illustrates a retracted state of the latch mechanism 232, in accordance with some embodiments. The movable components of the latch mechanism 232 are shown retracted into the housing 310 of the magnetic attachment mechanism 230 such that the movable components do not extend beyond the external surface of the housing 310. In the retracted state, the movable components do not extend beyond the external surface of the housing 310 such that the movable components are free of any interference with the surface feature in the recess 214 of the housing 212 (shown in FIG. 2).

Figure 6A:
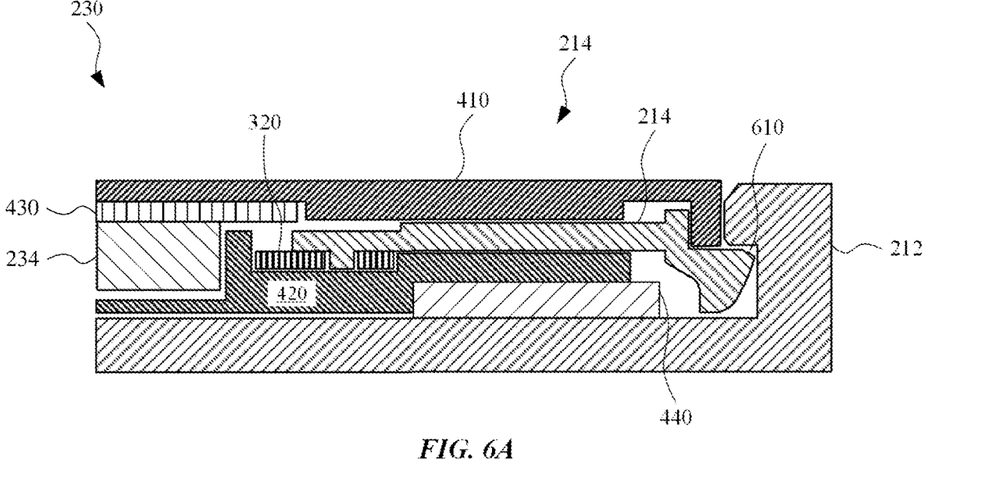
FIGS. 6A-6B illustrate a cross section of the magnetic attachment mechanism as inserted into the recess, in accordance with some embodiments.
Figure 6B:
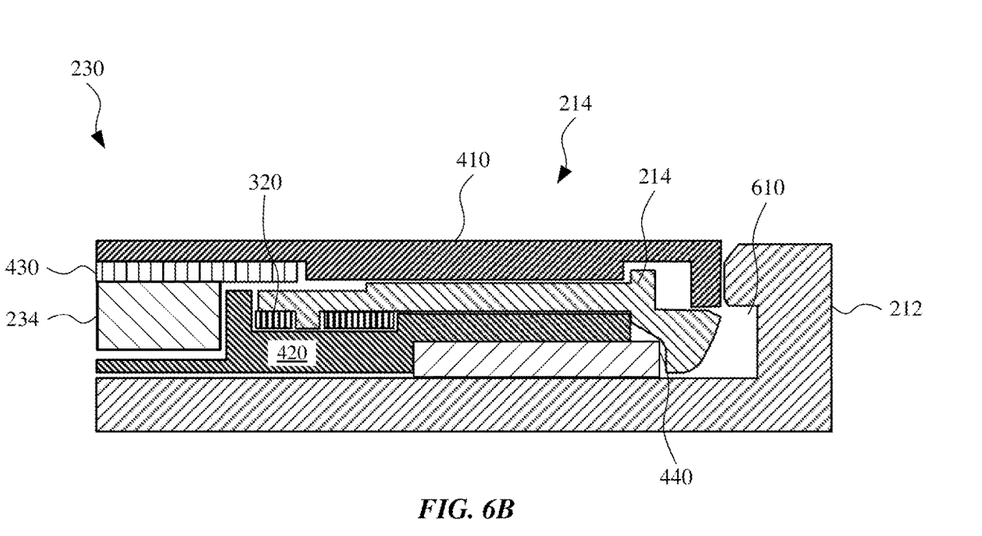

FIGS. 6A-6B illustrate a cross section of the magnetic attachment mechanism 230 as inserted into the recess 214, in accordance with some embodiments. The recess 214 includes a recess formed in the housing 212 of the display unit 210 (shown in FIG. 2). As depicted in FIG. 6A, the magnetic attachment mechanism 230 is in an extended state where the movable component of the latch mechanism 232 interfaces with a surface feature 610 formed in the recess 214 of the housing 212. In some embodiments, the surface feature 610 includes an overhanging protrusion. The overhanging protrusion is characterized by a diameter of the recess 214 at the opening in the housing 212 that is less than a diameter of the recess 214 at a rear surface of the housing 212 at the bottom of the recess 214. The overhanging protrusion can also be referred to as a ledge or an undercut region. It will be appreciated that the surface feature 610 can be formed in the housing 212 by a machining operation, such as a milling operation with a slot cutter tool. Alternatively, the surface feature 610 can be formed by attaching a second component to a face of the housing 212. For example, a second component with an opening formed therein can be attached to the face of the housing 212 to form the overhanging protrusion via the combination of the first component having an opening of a first diameter disposed over the recess 214 having a second diameter that is greater than the first diameter.

The pad 440 contacts or is otherwise substantially adjacent to a rear surface of the recess 214. The pad 440 is attached to a front housing component 420 attached to a rear housing component 410 via mechanical fasteners (not explicitly shown in the cross-section of FIGS. 6A-6B). It will be appreciated that a cross section of the front housing component 420 and the rear housing component 410 can be different at other locations of the magnetic attachment mechanism 230, such that the a surface of the front housing component 420 contacts a mating surface of the rear housing component 410, and that a threaded hole can be formed in the mating surface for attaching said components to form the housing 310 (shown in FIG. 3) of the magnetic attachment mechanism 230.

The magnetic element 234 and the magnetic shunt 430 are disposed between the front housing component 420 and the rear housing component 410. The movable components of the latch mechanism 232 are similarly disposed between the front housing component 420 and the rear housing component 410, with a protrusion of the movable component disposed in a slot of the actuating mechanism 320. The position of movable component of the latch mechanism 232 can be controlled by a position of the slot in the actuating mechanism 320. Thus, a position of the slot in the actuating mechanism 320 can determine whether the movable component of the latch mechanism 232 is extended under the overhanging protrusion of the surface feature 610 formed in the recess 214. The interference between the movable components of the latch mechanism 232 and the surface feature 610 can prevent the extraction of the magnetic attachment mechanism 230 from the recess 214.

As depicted in FIG. 6B, the magnetic attachment mechanism 230 is in a retracted state where the movable component of the latch mechanism 232 does not interfere with the surface feature 610 formed in the recess 214 of the housing 212, thereby enabling the magnetic attachment mechanism 230 to be extracted from the recess 214. Again, the position of movable component of the latch mechanism 232 is controlled by a position of the slot in the actuating mechanism 320. Thus, a position of the slot in the actuating mechanism 320 can determine whether the movable component of the latch mechanism 232 is retracted into housing 310 of the magnetic attachment mechanism 230, free of the overhanging protrusion of the surface feature 610 formed in the recess 214.

In some embodiments, the actuating mechanism 320 can be characterized by two states, with the states based upon rotation of the actuating mechanism 320 relative to the protrusion of the movable component of the latch mechanism 232. A first state can be referred to as an unlocked state, where the slots in the actuating mechanism 320 allows free motion of the movable components of the latch mechanism 232 between the extended state and the retracted state. A second state can be referred to as a locked state, where the slots in the actuating mechanism 320 force the movable components of the latch mechanism 232 in the extended state. In other words, the slot in the actuating mechanism 320 can be wider in the unlocked state than in the locked state.

In such embodiments, the movable components of the latch mechanism 232 can be biased towards the extended state. For example, springs can be included as a part of the latch mechanism 232 to force the movable components away from a central axis of the magnetic attachment mechanism 230. In such cases, with the actuating mechanism 320 in the unlocked state, the insertion of the magnetic attachment mechanism 230 into the recess 214 while the movable components are in the extended state allows the movable components to move from the extended state to the retracted state, compressing the springs, until the movable components are beyond the surface feature 610. Once the movable components are beyond the surface feature 610, the springs force the movable components to move back into the extended state, thus locking the magnetic attachment mechanism 230 in the recess 214.

Figure 7:
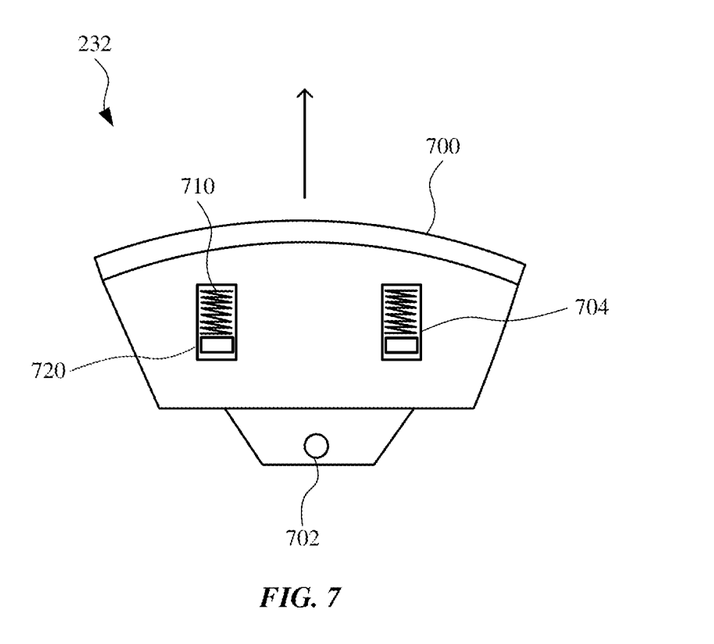
FIG. 7 illustrates a biasing mechanism of the latch mechanism, in accordance with some embodiments.

FIG. 7 illustrates a biasing mechanism of the latch mechanism 232 (shown in FIG. 3), in accordance with some embodiments. As depicted in FIG. 7, a movable component 700 of the latch mechanism 232 includes a protrusion 702 that is designed to interface with a slot of the actuating mechanism 320 (such as the slot 322, shown in FIG. 3). The movable component 700 of the latch mechanism 232 also includes slots, with each slot accepting a biasing mechanism. For example, the movable component 700 includes a slot 704 that accepts a biasing mechanism 710. As shown in FIG. 7, the biasing mechanism 710 is a spring. However, other mechanism with a force dependent upon a spring constant and a distance/length (of the biasing mechanism) are possible. The biasing mechanism 710 can be disposed between a surface of the slot 704 and a surface of a protrusion 720. The protrusion 720 may attach to one of the front housing component 420 or the rear housing component 410 of the housing 310 (shown in FIG. 4).

Although, the biasing mechanism 710 is shown to bias the movable component 700 in the extended state, it will be appreciated that, in some embodiments, the biasing mechanism 710 can be configured to bias the movable component 700 in the retracted state. In such embodiments, the latch mechanism 232 will not automatically engage with the surface feature 610 (shown in FIGS. 6A and 6B) in the recess 214 when the magnetic attachment mechanism 230 (shown in FIGS. 6A and 6B) is inserted into the recess 214. Instead, the actuating mechanism 320 is utilized to force the movable component 700 into the extended state after the magnetic attachment mechanism 230 is inserted into the recess 214. It should be noted that additional movable components of the latch mechanism 232 are designed to function in a manner similar to the movable component 700.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments.

Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An attachment mechanism to secure a display unit to a stand, the attachment mechanism comprising:
    a housing defining a central axis;
    a latch mechanism attached to the housing and comprising:
        a movable component including a protrusion and a first slot;
        a biasing mechanism disposed between a surface of the first slot and a surface of the protrusion; and
        an actuating mechanism coupled to the housing and including a second slot, the protrusion being positioned in the second slot;
    wherein rotational movement of the second slot relative to the housing radially displaces the protrusion to extend or retract the moveable component relative to the central axis of the housing.

2. The attachment mechanism of claim 1, further comprising a magnetic element disposed in the housing to couple with the display unit.

3. The attachment mechanism of claim 1, wherein the latch mechanism automatically locks the housing to the display unit when the housing is fully inserted into the recess.

4. The attachment mechanism of claim 1, wherein the movable component is movable between a first position extending beyond the housing and a second position within the housing.

5. The attachment mechanism of claim 4, wherein the protrusion moves relative to the second slot during movement of the movable component moving from the first position to the second position.

6. The attachment mechanism of claim 1, wherein the biasing mechanism biases the movable component radially away from the central axis of the housing.

7. The attachment mechanism of claim 6, wherein the protrusion is a first protrusion and the biasing mechanism comprises a second protrusion and a spring configured to apply a biasing force between the movable component and the second protrusion.

8. The attachment mechanism of claim 1, wherein the latch mechanism comprises a set of circumferentially spaced apart movable components.

9. The attachment mechanism of claim 1, wherein the actuating mechanism is configured to be manually operated for displacement of the movable component.

10. The attachment mechanism of claim 1, wherein the housing comprises:
    a front housing component; and
    a rear housing component coupled with the front housing component, wherein the front housing component and the rear housing component at least partially surround the actuating mechanism and the latch mechanism.

11. A stand for a display unit that includes a housing with a recess therein, the stand comprising:
    a structural support;
    an attachment mechanism coupled to the structural support and insertable into the recess of the housing of the display unit, the attachment mechanism comprising:
        a first housing component;
        a second housing component secured to the first housing component; and
        a latch mechanism disposed between the first housing component and the second housing component, the latch mechanism comprising:
            a set of movable components, each movable component of the set of movable components comprising a respective spring biasing a single movable component of the set of movable components in a radially outward direction relative to an edge of the first housing component, wherein the respective spring engages a surface of the single movable component and a surface of the first housing component, wherein the respective spring is disposed in a slot defined by the single movable component.

12. The stand of claim 11, further comprising a cam mechanism movable between a first position and a second position different from the first position, wherein each of the set of movable components is locked in an extended position when the cam mechanism is in the first position.

13. The stand of claim 12, wherein each of the set of movable components is movable from the extended position to a retracted position when the cam mechanism is in the second position.

14. The stand of claim 13, wherein each of the set of movable components is positioned within a perimeter of the first housing component in the retracted position.

15. The stand of claim 11, further comprising a pad positioned on the first housing component and configured to face the display unit.

16. A modular display system, comprising:
    a display housing defining an internal volume and a recess;
    a display unit carried by the display housing within the internal volume; and
    a stand supporting the display housing via an attachment mechanism positioned on the stand, the attachment mechanism comprising:
        an attachment mechanism housing having a central axis;
        an actuating mechanism; and
        a latch mechanism including a movable component, the movable component defining a slot;
        a biasing mechanism positioned in the slot and configured to bias the movable component radially away from the central axis;
        wherein rotation of the actuating mechanism linearly extends the movable component away from the central axis.

17. The modular display system of claim 16, wherein the recess includes a circular shape, and the attachment mechanism housing includes a corresponding circular shape.

18. The modular display system of claim 16, wherein the latch mechanism includes at least two movable components spaced around a perimeter of the attachment mechanism housing.

19. The modular display system of claim 16, wherein the latch mechanism is lockable in a radially extended position by the actuating mechanism.

20. The modular display system of claim 19, wherein rotation of the actuating mechanism overcomes a biasing force applied to the movable component by the biasing member to retract the movable component relative to the central axis.

* * * * *